Figure 1A:
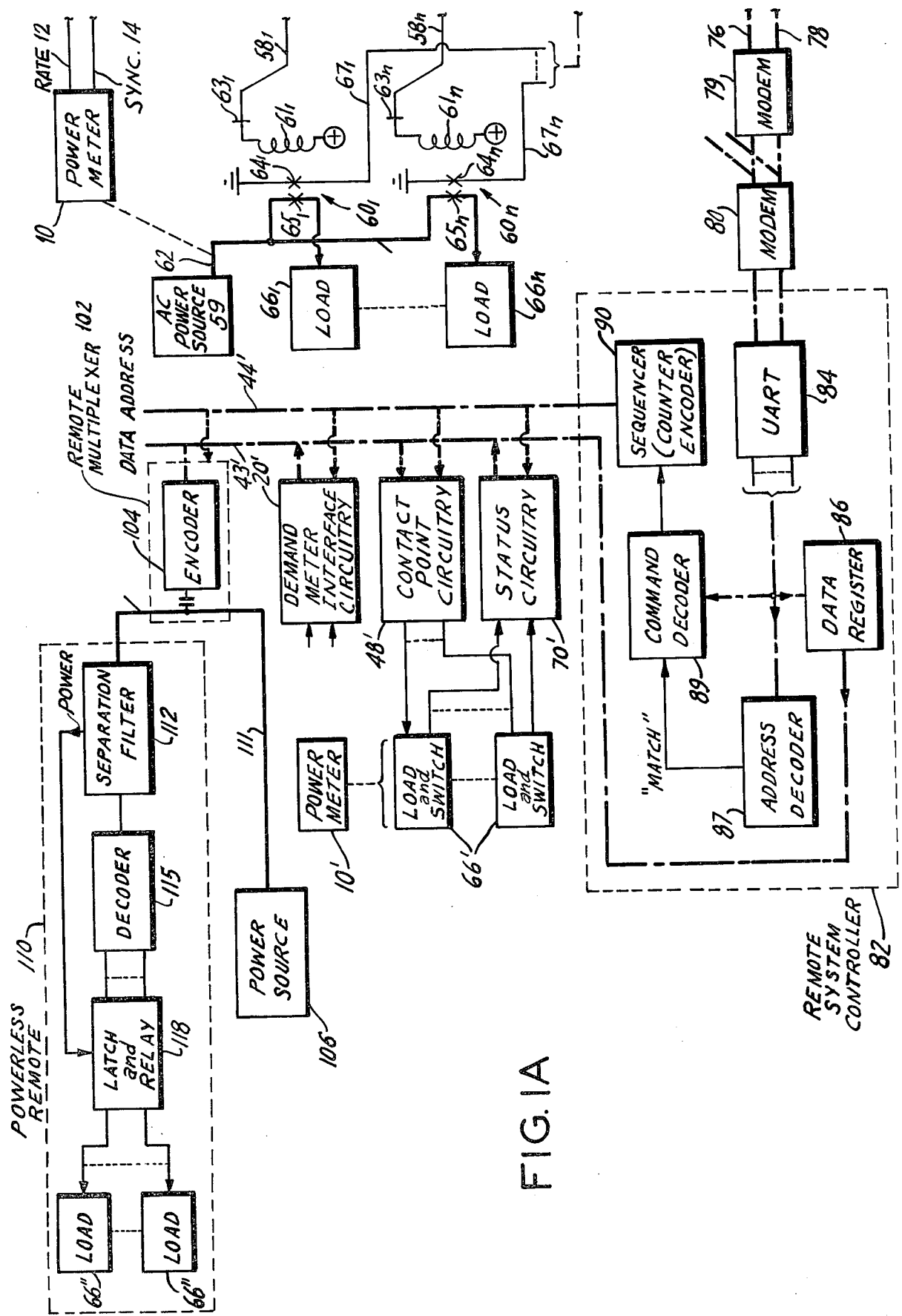

United States Patent [19]

Schneider et al.

[11] 4,075,699

[45] Feb. 21, 1978

[54] POWER MONITORING AND LOAD SHEDDING SYSTEM

[75] Inventors: Richard A. Schneider, Edison, N.Y.; Gerald L. Freed, Highland Park; Richard Lipnick, Scotch Plains, both of N.J.

[73] Assignee: Lockheed Electronics Co., Inc., Plainfield, N.J.

[21] Appl. No.: 699,571

[22] Filed: June 24, 1976

[51] Int. Cl.² .................... G01R 21/00; G05B 15/02
[52] U.S. Cl. .................... 364/492; 324/103 R
[58] Field of Search ............ 235/151.21, 92 EL; 444/1; 340/172.5; 324/103 R; 307/57, 87, 29, 31

[56] References Cited

U.S. PATENT DOCUMENTS

| 3,387,121 | 6/1968 | Maczuzak et al. | 235/151.21 |
| 3,505,508 | 4/1970 | Leyde | 235/151.21 X |
| 3,522,421 | 8/1970 | Miller | 235/151.21 |
| 3,602,703 | 8/1971 | Polenz | 235/151.21 |
| 3,652,838 | 3/1972 | Dillon et al. | 235/151.21 X |
| 3,740,572 | 6/1973 | Cohn | 235/151.21 X |
| 3,932,735 | 1/1976 | Giras | 235/151.21 |

Primary Examiner—Edward J. Wise

[57] ABSTRACT

An electrical power controlling/load shedding system includes power consumption metering and meter interfacing circuitry for entering overall power consumption into a central processing unit. The CPU memory includes a data storage table characterizing each system electrical load under each of a hierarchy of operational levels, and circuitry is provided for turning local and remote loads on/off, responsive to CPU-issued commands.

The digital computing apparatus operates on the meter supplied information and projects energy consumption over the monitoring interval. If power must be shed to obviate an excessive projected demand, loads are examined seriatim and selectively shed on a priority basis as required, depending upon the operational parameters and status characterizing each load for the then prevailing load level condition.

16 Claims, 4 Drawing Figures

POWER MONITORING AND LOAD SHEDDING SYSTEM

This invention relates to electronic power monitoring/regulation systems and, more specifically, to stored program controlled apparatus for selectively shedding power loads to maintain energy consumed during each monitoring interval within prescribed bounds.

The cost of electrical energy is an important economic expense factor in many industrial installations and applications—a matter reinforced by the marked fuel charge increase of recent years passed along by electrical utilities to their consumers. The cost of A.C. electrical energy paid by industry is dependent, as a generality, upon both energy (e.g. measured in kilowatt hours) consumed over a billing period (e.g., a month), and also the peak power consumption rate (e.g., the greatest number of kilowatt hours consumed during any 15 minute or half-hour period, or the like). The specific billing practices of utilities differ but all to the same effect of penalizing a power consumer who has a high peak power consumption rate vis-a-vis total power consumed. This charging practice, of course, assures an adequate return for power companies which must install capital generating equipment to satisfy peak rather than average demand.

Thus, an industrial consumer which consumes electrical power at a high rate, even for a very short period of time, will be subject to a severe increase in its total power costs — in some areas applied as a higher rate applied to energy consumed by the user.

It is thus an object of the present invention to provide an improved power control system.

More specifically, it is an object of the present invention to provide apparatus for monitoring power consumed, and for shedding A.C. or D.C. loads to maintain power consumed over each monitoring interval within prescribed bounds.

It is another object of the present invention to provide a power monitoring/regulation system in which the characteristics (and use priority) of each system loan can be redefined as desired, as pursuant to passage of time, under external sensor stimulus (e.g temperature, process rate or the like), or under local or distant manual entry, as via a teletypewriter.

It is yet another object of the present invention that power controller apparatus be expandable, and control loads and load controllers physically disposed at local and remote locations.

The above and other objects of the present invention are realized in a specific, illustrative power controlling-/load shedding system which includes power consumption metering and meter interfacing circuitry for entering overall power consumption into a central processing unit. The CPU memory includes a data storage table characterizing each system electrical load under each of a hierarchy of operational levels, and circuitry is provided for the CPU to turn local and remote loads on and off in accordance with stored energy consumption projecting and load shedding algorithms.

In brief, the digital computing apparatus operates on the meter supplied information and projects energy consumption over each of successive monitoring intervals. If power must be shed to obviate an excessive projected demand, loads are examined seriatim and selectively shed on a monotonically increasing priority basis as required, depending upon the operational parameters and status of each load for the then prevailing load level condition.

Figure 2:
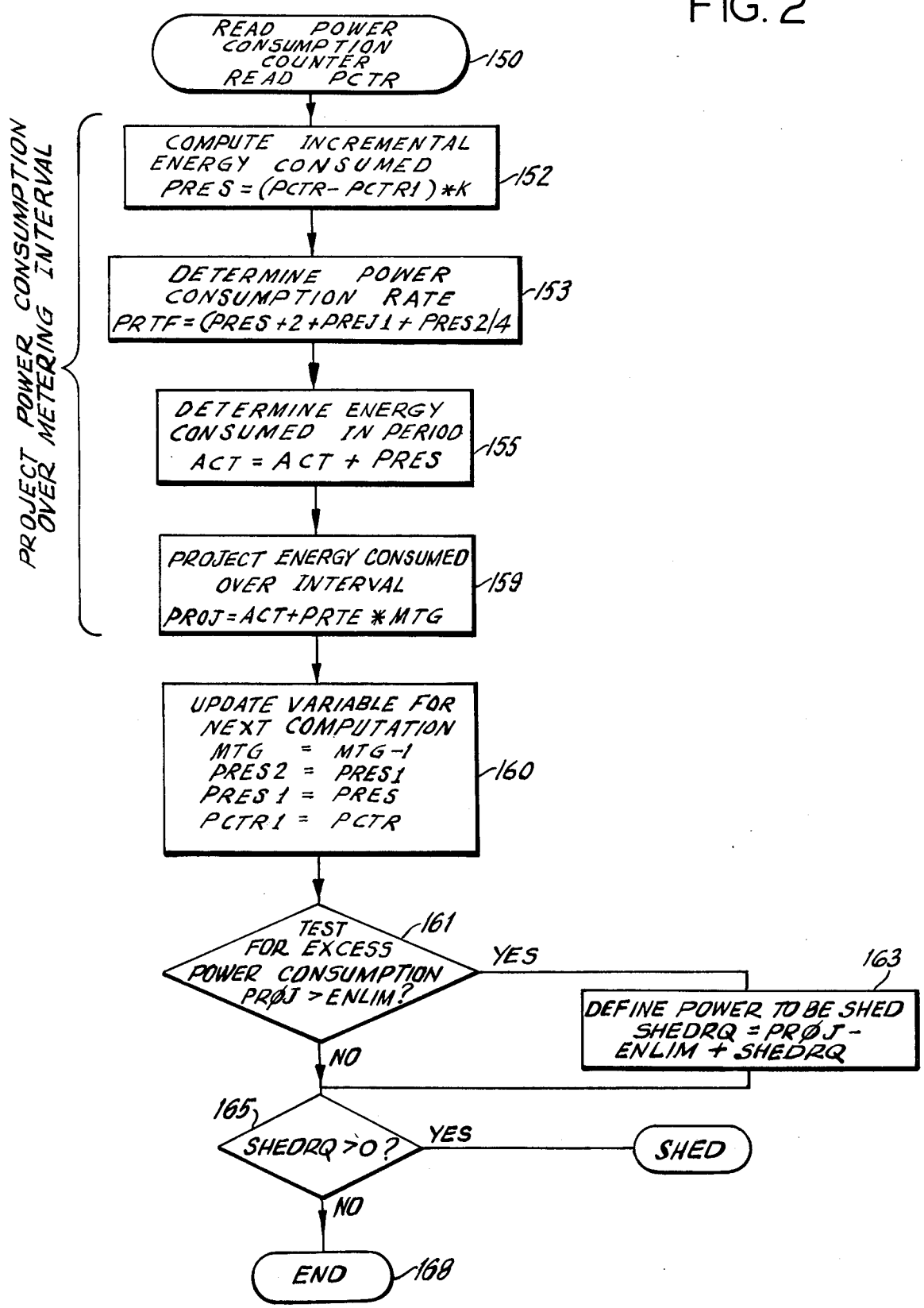
Figure 3:
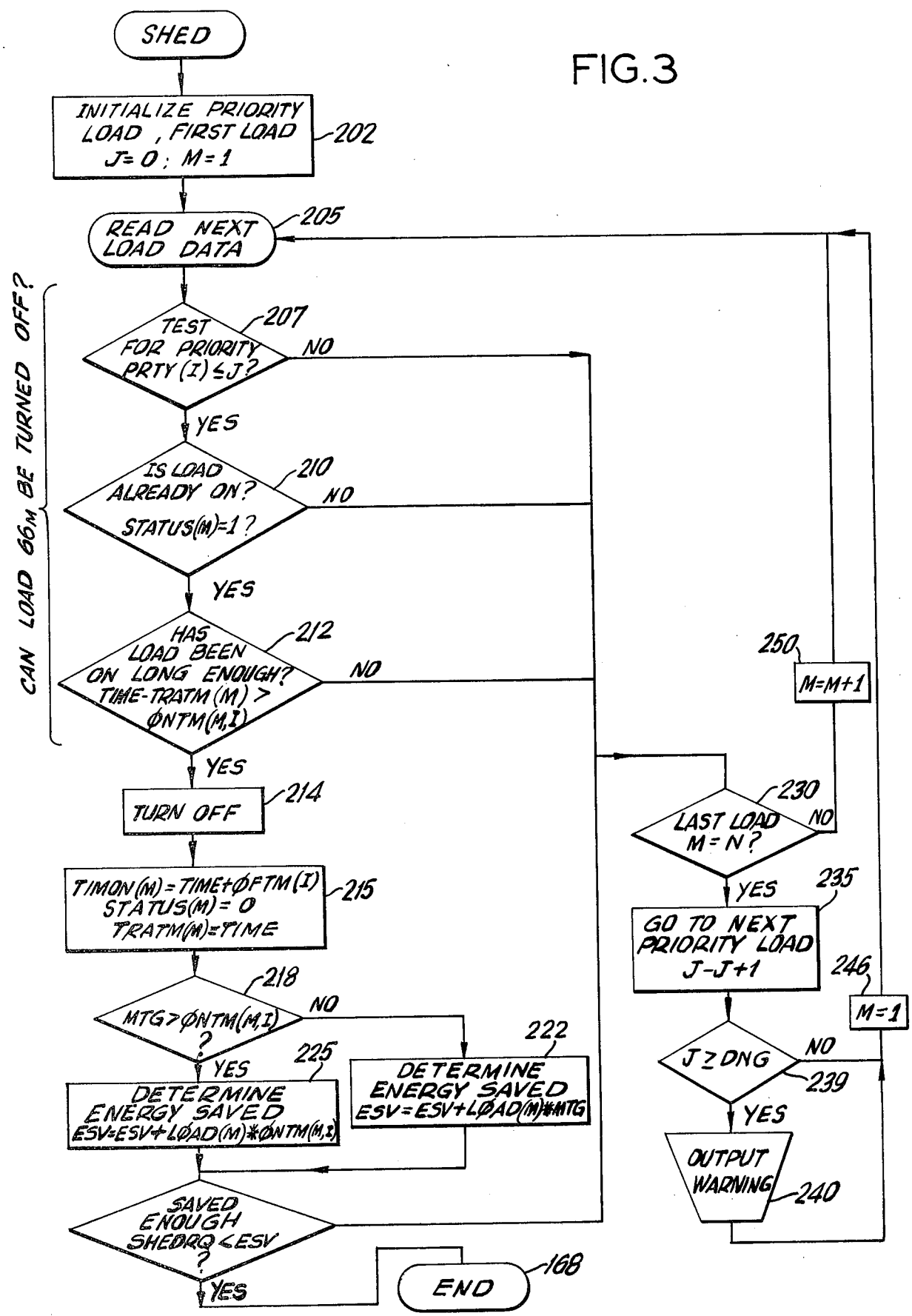

The above and other features and advantages of the present invention will become more clear from the following detailed description of specific, illustrative power monitoring and load controlling apparatus, presented in conjunction with the accompanying drawing, in which:

FIGS. 1A and B are respectively the left and right portions of a composite power monitoring and load shedding system in accordance with the principals of the present invention;

FIG. 2 is a flow chart illustrating data processing to project line energy consumption over a monitoring interval, and for defining load shedding requirements; and FIG. 3 is a flow chart characterizing a data processing SHED algorithm selectively disabling system loads as required.

Referring now to FIGS. 1A and B hereinafter referred to as composite FIG. 1, there is shown a power monitoring and load shedding system embodying the principals of the present invention, which includes a power meter 10 for monitoring the power consumed by an array of system loads $66_1$–$66_n$ energized by an A.C. power source 59 via a power distribution bus 62. The power meter 10 supplies as a first output on a lead 12 information indicative of the rate energy is being consumed by the system loads 66, typically in the form of a sequence of pulses where each pulse represents a predetermined quantum of energy. The power meter 10 will also typically supply at an output lead 14 synchronizing information identifying the relatively short period over which the energy consumed is to be determined. Thus, for example, where energy consumption is monitored on the basis of fifteen minute intervals, the sync line 14 will be activated once every fifteen minutes. Alternatively, the monitoring periods may correspond to real time intervals (e.g., every quarter hour) are signalled by a real time clock 41 discussed below.

It will be recalled that the charge for industrial power has a factor dependant upon the peak power consumed during any monitored interval. Accordingly, as an overall desideratum, the system operates to avoid excessive peak energy consumption during any monitoring interval signalled by the sync output of the meter 10. This is effected as a generality by modulating the on/off status of lower priority loads to shift a portion of the energy requirements for such loads to periods when A.C. loads of a higher order of significance exhibit lower demand requirements.

To this end, demand meter interface circuitry 20 receives the power 12 and synchronizing 14 output information from the power meter 10 and passes this data to a digital computer 30. As shown, the computer 30 employs a central processing unit 31 and a memory 32 for receiving and operating upon the power consumption information via a peripheral interface adapter (P.I.A.) 33 and common data and address busses 43 and 44. The particular structure shown for the digital computer 30 in FIG. 1 (to include a series of priority interrupts 35 passing to a priority interrupt encoder 34) is merely illustrative and may be implemented by a range of processor organizations including standard general purpose computers, mini-computers and micro-processor configurations. For example, the mini-computer vended by the assignee of the instant application under the trade style MAC 16 may well be utilized.

In accordance with conventional common data and address bus 43 and 44 computer operation, the demand meter interface circuitry 20 (as well as contact point and control circuitry 48, status circuitry 70, sensor(s) 42, and a remote coupler 73, all discussed below) are treated as peripherals connected to the system busses 43 and 44 for selection and connection - unilateral or bilateral are required, with the computer 30 and CPU 31 in particular.

To this end, the demand meter interface circuitry 20 includes a counter 22 advanced by the energy consumption signalling pulses supplied by the meter 10, and a status register 24 (e.g., a simple flip-flop) which is set when each new sync pulse is received from the meter 10 via the lead 14. The outputs from the counter 22 and status register 24 are selectively gated by gate circuitry 26 onto the data bus when the interface circuitry 20 is addressed by the computer 30 via the address bus 44. Again as per se conventional for common bus computer cooperation for "peripheral" selection, the interface circuitry 20 includes an address decoder 27 connected to the address bus 44 to determine whether the circuitry 20 is being polled by the CPU 21 and, if so, to enable the gate 26 to multiplex the counter 22 and status register 24 contents onto the data bus 43 for communication to the CPU 31. A delay element 26 operates to clear the status register 24 (e.g. reset a status flip-flop) at the conclusion of each polling cycle. In this manner, a computer variable ascribed the mnemonic name "PCTR", identifying the count state of the counter 22, is loaded into an appropriate storage cell (schematically denominated PCTR) via the central processing unit 31.

Contact point and control circuitry 48 is employed to actuate/disable the controllable system power consuming loads 66. There may, and generally will be power-draining loads connected to the power source 59 which may not be switched on or off by the CPU 31. The power consumed by such loads is, of course, reflected in the output of power meter 10 and thus taken into account by the instant apparatus. However, beyond this observation, such loads are not further considered.

The contact point and control circuit 48 includes a control register 49 loaded via the data bus 43 when the circuitry 48 is identified by the contents of the address bus 44. As again is per se conventional in the common bus digital computer field, each of the circuits communicating with the CPU 31 via the common busses 33 and 34, e.g., the circuitry 20, 42, 48, 70 and 73 herein discussed, each includes an address decoder comparable to the decoder 27 shown in the meter interface circuitry 20 specifically discussed above (each decoder, of course, being adapted to respond to unique digital address word). Each address decoder responds to computer 30 generated address signals on the address bus 44 which identify when that "peripheral" item is selected by the computer 30 for communications therewith and appropriately connect the selected peripheral to the data bus (as via gating 26 shown for the interface circuitry 20). The apparatus comparable to the address decoder 27 and multiplxing elements 26 discussed in conjunction with the meter interface circuitry 20 will hereinbelow be presumed to be included in all apparatus connected to the common data and address busses 43 and 44 (and to any remote data and address busses 43' and 44') and will not be further considered.

Returning now to the specific operation of the contact point and control circuitry 48, the i-th stage of the register 49 selectively energizes/de-energizes the coil $50_i$ of a relay $49_i$ for selectively controlling the energized/de-energized state of a corresponding load $66_i$. The load $66_i$ is selectively connected to the source of A.C. power 59 via a power contacts $65_i$ of a relay $60_i$ having a relay activating coil $61_i$. The relay coil $61_i$ is selectively connected by one transfer switch member $54_i$ of a two pole, three position switch $53_i$ and a normally open contacts $51_i$ of the relay $49_i$.

To illustrate load control by way of specific example, and with the double pole switch $53_i$ in its uppermost position in the drawing, when the i-th stage of the register 49 signals that the load $66_i$ is to be energized, it presents an appropriate binary digit, e.g., a binary "1". This output bit energizes the coil $50_i$, either directly for a sensitive relay or indirectly via a buffer amplifier or gate (not shown) thus actuating the relay contacts $51_i$. The closed contacts $51_i$ complete an energizing circuit path for the relay $60_i$ located about the load $66_i$ location via normally closed contacts $63_i$ (discussed below). The energized relay $60_i$ closes normally open contacts $65_i$ thus completing the circuit from the A.C. power source 59 to the load $66_i$.

Correspondingly, if a "power off" bit (e.g., a "0") is present at the i-th stage of register 49, the relays $60_i$ and $49_i$ are unenergized, and the load $66_i$ is disconnected from the power source 59 via opened contacts $65_i$.

The normally closed contacts $63_i$ may be disposed about the load area to disable a relay $60_i$ (and thereby also the load $66_i$) independent of the output of the processor 31 as loaded into the register 49. Thus, for example, the contacts $63_i$ may comprise an emergency switch, the output of a local sensor to signal overload or excessive temperature conditions, or the like.

The second pole $55_i$ of each switch $53_i$ in the contact point and control circuitry 48 is coupled as an input by a conductor $56_i$ to a register 71 in status circuitry 70, as is a signal passing through a second signal level (e.g., "dry") contact $64_i$ of the load controlling relay $60_i$ via a conductor $67_i$. The signal conveyed to the register 71 by the conductor $56_i$ reports to the CPU 31 whether or not the load $66_i$ is capable of being controlled by the computer 30, i.e., operated or shed as required. To this end, note that if the double pole switch $53_i$ is in other than its uppermost position, the load $66_i$ cannot be controlled by the CPU 31 which no longer has access to the relay $60_i$. This fact is reported to register 71 by the switch transfer member $55_i$ which supplies a ground signal (a binary "0" for commonplace current sinking integrated circuit logic) when switch $53_i$ is in its uppermost position, and an open circuit signal (a "1") otherwise.

Similarly, the ground/open signal reported to the register 71 via contact $64_i$ and lead $67_i$ confirm to the CPU 31 the actual state of a controlled load $66_i$, independent of the command issued therefor by the computer 30. To this end, note that the computer 30 may signal that load $66_i$ be energized when, in fact, the load may be unenergized, as by an opening of the contacts $63_i$ because of some locally prevailing condition at the load $66_i$, because of a system fault in circuitry 48, a severed conductor, or the like.

Accordingly, the above described system apparatus is fully effective to load power consumption and synchronizing information from the meter 10 into the CPU 31 and memory 32, to issue commands from the memory - CPU 31, 32 to turn each controlled load $66_1$–$66_n$ on or off, and to monitor the status thereof via the status circuitry 70.

By way of additional system apparatus, the computer 30 includes a priority interrupt encoder 34 to directly input into the central processing unit 31 on a priority basis a signal from circuitry 36 signalling that power has failed; messages supplied by external peripheral units 38, e.g., a teletypewriter; and time of day information supplies by a real time clock 41. Again, as well known to those skilled in the art, the informational sources 36, 38, 41 may alternatively be connected as additional "peripherals" to the busses 33 and 34 rather than supply information via the CPU interrupt port (and the "peripheral" items connected as priority interrupts with or without direct memory access). Also, where a minicomputer is employed with priority interrupt capability (such as the aforementioned LEF 16 assemblage), no separate priority interrupt encoder 34 need be employed.

Figure 1B:
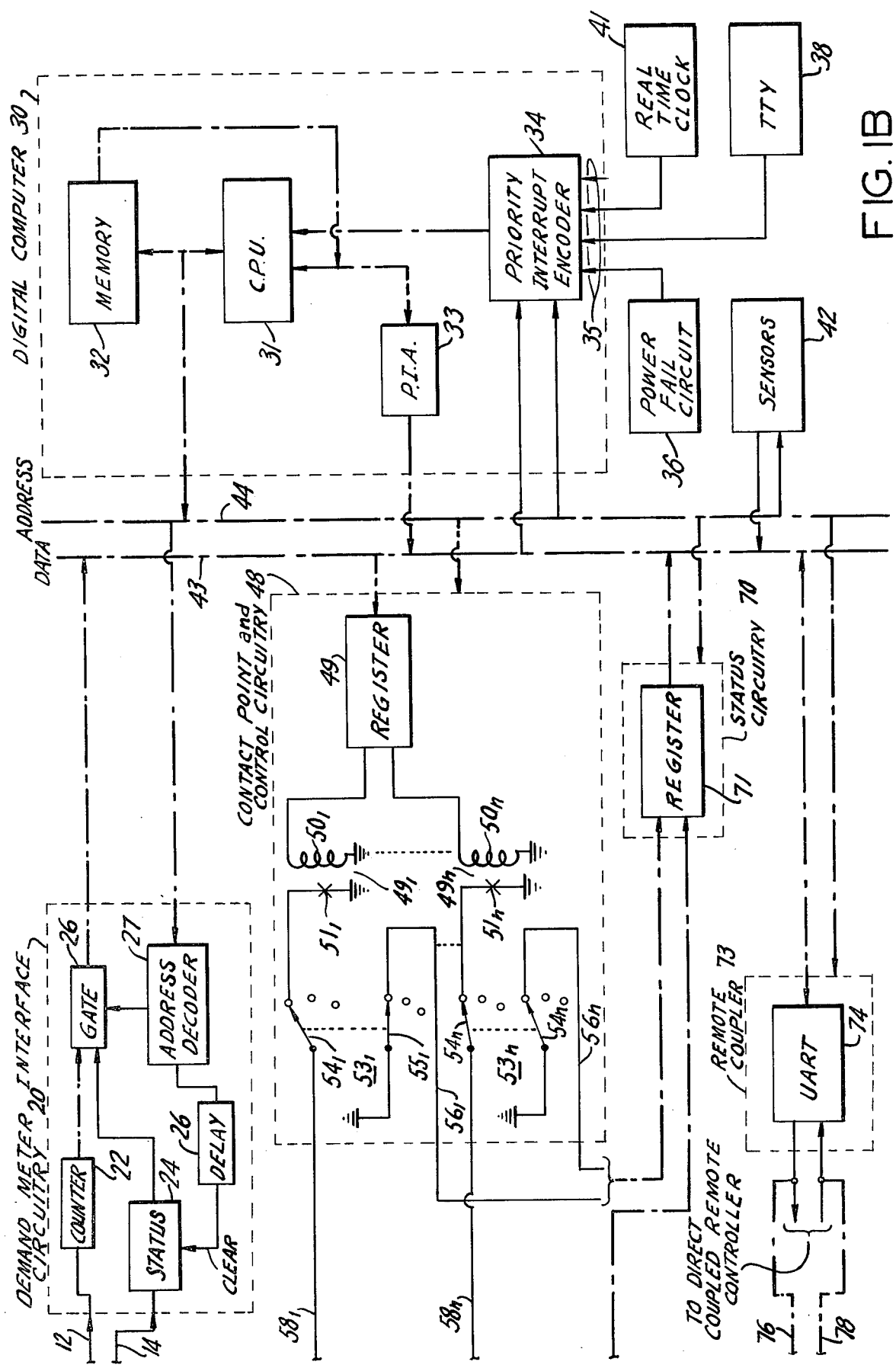

The FIG. 1 system further includes sensors 42, e.g., connected as a peripheral, to the data and address busses 43 and 44 to supply thereto signals characterizing those parameters of the controlled industrial plant which are of interest in making power shedding decisions. For example, such parameters may comprise ambient temperature (which may, for example, establish priorities for heating/cooling A.C. loads), plant process rate, product mix, or the like.

In accordance with one aspect of the present invention, the above considered apparatus may be employed as well to control loads disposed in locations spatially remote from the CPU 31, e.g., loads 66' and 66". To this end, signal coupling apparatus connects the busses 43 and 44 with a remote system controller 82 which, in turn, operates remote data 43' and address 44' busses in a manner comparable to the busses 43 and 44 directly controlled by the computer 30. Connected to the busses 43' and 44' are demand meter interface circuitry 20' connected to a load 66' monitoring power meter 10' (the A.C. source and relays comparable to relays 60' being deleted for clarity), contact point and control circuitry 48' and status circuitry 70' which perform in a manner directly analogous to the like unprime-numbered elements discussed above. Thus, for example, a remote coupler 73 including a UART 74 (universal asyncronous receiver and transmitter), versions of which are available from several different manufacturers in integrated circuit form, may be employed to communicate with a UART 84 in the remote system controller 82. For communication over an extended distance, modems 79 and 80 are employed, with date signalling being effected over a duplex circuit 76, 78. Where long distance communications are not required, the output of the UART 74 may be directly connected to a remote system control 82 for controlling power loads.

Remote system controller 82 may simply include an address decoder 87 for identifying that it is the peripheral being addressed by the computer 30 and for enabling a command decoder 89 to enable a sequencer 90, e.g., a counter-decoder combination to actuate the interface circuitry 20', circuitry 48' and 70' in turn via the remote address bus 44' for communication with the CPU 31 via the remote data bus 43', a data register 86, and the UART 84-TO-UART 74 communications link.

Yet, further, loads 66" may be controlled via a remote multiplexer peripheral 102 connected to any of the system data, address busses 43, 44, or 43', 44', whichever is more physically convenient to a load 66". The remote multiplexer 102 operates as a "powerless" remote in the sense of supplying A.C. power from a power source 106 to loads 66" as well as control information. To this end, multiplexer 102 includes an encoder to encode the bus 43', 44' information in a manner suitable for multiplexing with 60 cycle A.C. power from source 106, as for delivery on a twisted pair 111. Such power/signal multiplexing may be effected in varying ways well known to those skilled in the art, e.g., by utilizing frequency division multiplexing as where the encoder performs frequency shift keying, amplitude of frequency modulation, PCM, PAM, or the like.

At the load location, a powerless remote terminal 110 includes a separation filter 112 for delivering the low frequency A.C. power to latch and relay circuitry 118, and for supplying the control information to a decoder 115. The decoder 115 enters data in the latch (register) portion of circuitry 118 which effects a control function to deliver the A.C. power to those of the array of controlled loads 66" which are to be turned on in accordance with the information last supplied by the decoder 115.

Thus, the composite FIG. 1 apparatus includes all requisite structures for monitoring and controlling loads 66, 66' and 66" in local and remote locations - even where A.C. energy may not otherwise be available.

The particular manner in which the FIG. 1 apparatus, and the central processing unit 31 and memory 32 in particular, operate to control the system load 66, shedding power consuming devices as required, will now be considered. In the discussion below, illustrative, non-literal FORTRAN-type coding statements will be presented to characterize data processing. It will, of course, be readily apparent to those skilled in the art that any other program language may be employed to effect the basic computational algorithms described without departing from the spirit and scope of the present invention.

Referring now to FIG. 2, there is shown a flow chart for data processing by the central processing unit 31 and memory 32 to project energy consumption over the monitoring interval, e.g., each assumed 15 minute period. It will be recalled from FIG. 1 that the synchronizing output signal conductor 14 from the power meter 10 will typically supply the requisite synchronizing information. Alternatively, where absolute real time periods, e.g., every quarter hour, are utilized to compute peak demand, such monitoring periods are derived from the information supplied to the computer by the real time clock 41 rather than the meter 10.

For the computation depicted in FIG. 2, let computational variables (as well known to those skilled in the art, each corresponding to a storage location in memory 32) be defined as follows:

ACT = Total energy consumed from the inception of a monitoring period through the present machine computational operation;

ENLIM = The maximum energy permitted to be consumed over the monitoring interval;

ENSV = Minimum energy shedding requirement if the equipment is operating in an energy saving mode;

MTG = Minutes to go in the energy consumption metering cycle, e.g., initialized at 15 for a 15 minute monitoring period and decrimented by one for each one minute passage of time as reported by the real time clock 41;

PCTR = The last count state of counter 22, as above noted, which is periodically supplied to the CPU as the demand meter interface circuitry 20 is polled by the computer 30, e.g., once each minute;

PCTR1 = The state of counter 22 during the last previous counter 22 polling operation (i.e., the previous value of PCTR);

PRES = energy consumed over the last polling period, i.e., one minute for the assumed case;

PRES1/PRES2 = Energy consumed during the one minute and two minute previous periods, respectively;

PR$\phi$J = Energy consumption projected over the full monitoring period interval; and PRTE = Present overall rate of power consumption.

To illustrate operation of the FIG. 2 consumption projecting algorithm, which iteratively repeats during the assumed fifteen minute monitoring period, examine now data processing beginning an iteration during the intermediate part of the period. As a first matter, the state of the counter 22 is read into the PCTR variable location in memory 32 (step 150) by any conventional data entry statement. The power consumed during the previous one minute period (PRES) may then be determined by $$PRES = (PCTR - PCTR1) * K \quad (1)$$

where (PCTR - PCTR1) is the incremental count accumulated over the last one minute polling period, and K is a count-to-energy consumption conversion factor (step 152).

The present rate at which energy is being consumed (PRTE) - i.e., average power over the last one minute, is then $$PRTE = (PRES*2 + PRES1 + PRES2) / 4 \quad (2)$$

determined as the weighted average of power consumed during the last interval (PRES being given double significance) and over the previous two one minute periods as stored in PRES1 and PRES2 (step 153).

The actual power consumed from the beginning of the monitoring period through the present time (ACT) is updated, $$ACT = ACR + PRES. \quad (3)$$

The total energy projected to be consumed over the entire monitoring period (15 minutes) PR$\phi$J is computed by adding the actual power consumed from the beginning of the period to present (ACT) to the power predicted to be consumed over the remaining interval (product of the rate at which power is being consumed (PRTE) and the time remaining in the period (MTG)), as by $$PR\phi J = ACT + PRTE * MTG, \quad (4)$$

(steps 155 and 159).

Thus following the functional computation 159 the CPU 31 has available to it a projection of the energy which will be consumed over the monitoring interval (stored in PR$\phi$J). Before testing the contents of PR$\phi$J against the permissible energy limits (e.g., stored in ENLIM), the computational variables MTG, PRES2, PRES1, and PCTR1 are updated to be in a proper posture for the next computational cycle (step 160). The statements $$MTG = MTG - 1 \quad (5)$$

$$PRES1 = PRES \quad (6)$$

$$PRES2 = PRES1 \quad (7)$$

$$PCTR1 = PCTR \quad (8)$$

may be employed.

To determine whether some present system A.C. load(s) 66 need be shed, the projected energy consumed during the period (PR$\phi$J) is compared with the maximum permissible consumption (ENLIM) in any program language testing and conditional branching routine per se well known (functional block 161). If the contents of PR$\phi$J exceeded those of ENLIM, indicating that power must be shed (a "yes" result from the program test 161), a variable SHEDRQ containing the requirement of power to be shed is set to the difference, $$SHEDRQ = PR\phi J - ENLIM + SHEDRQ \quad (9)$$

If the equipment is operating in an energy saving mode where a minimum amount of energy (stored in ENSV) is to be shed independent of any actual excessive power rate, SHEDRQ is initialized to ENSV, e.g., at the beginning of each monitoring period, before entry into FIG. processing.

Thus in over-view and by way of summary, the FIG. 2 algorithm constantly projects the total energy which will be consumed over the monitoring period (contents of PR$\phi$J) by measuring the power actually consumed from the beginning of the monitoring period to present, and projecting future consumption based upon a weighted average of the rate of consumption. The projected consumption PR$\phi$J is then tested against the maximum permissible consumption (contents of ENLIM) and, if power is being consumed at an excessive rate, defines in a variable cell SHEDRQ the amount of power which must be eliminated to bring consumption down to a point where ENLIM is not exceeded (or to eliminate the ENSV amount if a power saver mode is employed).

Referring now to FIG. 3 there is shown the SHED algorithm which operates once SHEDRQ has been defined to actually turn off the necessary loads 66 to satisfy the power reduction requirement of SHEDRQ.

For purposes of the FIG. 3 algorithm, let additional storage variables be defined as follows:

M = an indexing variable identifying consecutive ones of the load $66_m$;

I = the operational level for each of the $m$ system load (more fully discussed below);

J = the priority level at which loads 66 are being shed, e.g., with J beginning at zero and with increasing numbers represent increasing priorities;

PRTY (M,I) = is a two dimensional vector signalling the priority entry in a load M data table for level I;

STATUS (M) = a one dimensional vector indicating the entry in the load M data table signalling whether the load is on or off, the binary bits "1" and "0" being assumed to respectively signal on and off conditions;

TIME = is a variable representing time of day reported by the real time clock 41;

TRATM(M) = a storage cell in the data table of a load M indicating the time of the last transaction for the load (e.g., when it was last either turned on or turned off);

TIM$\phi$N(M) = a variable signalling when the load M is to again be turned on;

$\phi$FTM(M,I) = the minimum off time for a particular load M when operated at level I;

$\phi$NTM(M,I) = the minimum on time for a particular load M when operated at level I;

LOAD (M) = is a load M data entry indicating the power saved when the load is off rather than on; and DNG = is a danger priority level.

As anticipated by the process variable designation table above, there is associated with each load $66_m$ a data table which includes level-independent variables (i.e., storage locations) which indicate whether the device is off or on (STATUS (M)), the power consumed by the device when on - and power saved when off (L$\phi$AD(M)); the time the device was last turned on or off (TRATM(M)); and the time an off device is to be turned on ($\phi$NTM(M)). There is also included in the data table for each load a plurality of storage cells (which may comprise bytes, or portions of one or more memory 32 locations) which vary with the level definitional descripter (I) for all loads. Thus, for example, it may be desired to differently described loads, e.g., as to priority (PRTY(M,I)) or minimum off or on time ($\phi$FTM(M,I), $\phi$NTM(M,I)) depending upon business hours vis-a-vis non-business week hours vis-a-vis weekend or holiday; to differently characterize loads depending upon some operational or environmental factor such as a temperature reported by sensor(s) 42; or to select load level via an input message entered via an input peripheral such as the teletypewriter 38. By way of one specific example, it will be apparent that an A.C. load such as air conditioning will be given a much higher load shedding priority when a sensor 42 is reporting an elevated temperature rather than a lower reported temperature. Similarly, priorities, minimum off, on times, and other level dependent variables will vary for lights, pumps, and the like depending upon such possible factors as production time versus various classifications of non-production times, cooling requirements, low material hopper fill levels, and the like.

As a conceptual matter, it is important to distinguish the level(I) which defines priority and some operational properties of the system loads 66, from the J-priority variable. As part of the FIG. 3 algorithm, where some loads up to the SHEDRQ requirement must be shed, the system first examines loads of the lowest priority (J = 0) value at the then obtaining load describing level, or I state (whatever that level is) and selectively shuts off some or all of the loads of priority zero, decrementing SHEDRQ as each load is shed.

If, after completion of processing for the lowest priority level, J = 0, J is incremented to the next level (J = 1) and shedding continues until the contents of SHEDRQ are satisfied. Throughout this procedure, the definitional level variable "I" will typically not change (unless there is a teletype message, sensor input or the like causing such change). Of course, if desired, it is possible to make I a function of J.

The SHED algorithm considered in overview above will now be discussed in greater detail in conjunction with the flow chart of FIG. 3). When the SHED routine is entered (as by defining a requirement to shed power is SHEDRQ), the load indexing variable M is initialized to 1 such that the processor 31 first considers the load $66_b$ and the priority variable J is set to 0 to attempt to shed the amount of power defined by the contents of SHEDRQ at the lowest load priority (step 202), as by $$J = 0, \tag{10}$$

$$M = 1. \tag{11}$$

Obviously also, all other processing initialization is effected as well.

The CPU steps 31 and memory 32 next fetch the indexed (M) load data, i.e., the data characterizing the load $66_m$ for the level I defined external to the SHED routine. The data block for the M-th load $66_m$ comprises level-independent variables such as power (L$\phi$AD(M)), time of last transaction (TRATM(M)), on-off status (STATUS(M)); and level dependent variables such as priority (PRTY(M,I)) and minimum off and on times ($\phi$FTM(M,I)) and ($\phi$NTM(M,I)). IF a CPU 31 with plural storage registers is employed, all such load describing variables may be stored in the CPU 31. Alternatively, as is per se conventional for indirect addressing, an index register or the like may be utilized to extract the load M parameters as required. Other data storage-interval arrangements are also well known to those skilled in the art for obtaining the load characteristics when needed.

After the load descriptors are obtained and/or isolated by functioning 205 (FIG. 3 processing) functional blocks 207, 210 and 212 test the load descriptors to determine whether or not the load may be turned off. In particular, test 207 examines the level dependent load priority (PRTY(M,I)) to determine whether or not the priority is less than the contents of J (J being at the lowest or 0 priority setting for the first iteration through the SHED loop). Assuming the test 207 is satisfied (acceptable load priority), test 210 examines the status (STATUS(M)) of the M-th load being tested to determine whether the load is on. It is obviously impossible to save energy by turning off a load which is already off. For a load which is on (test 210 satisfied), a test 212 determines that it has been on long enough to again be turned on, i.e., that the difference between the present time (TIME) and the time the device was turned off (TRATM(M)) exceeds the minimum on time for level I ($\phi$NTM(M,I)). If, and only if, each of the three tests 207, 210 and 212 are satisfied, the computer turns off the M-th load $66_m$ (step 214). The load turn off is effected in the manner above described by the CPU 31 entering a "0" binary digit in the M-th stage storage of the register 49.

Following load turn off, functional block 215 updates information in the data block associated with the M-th load to reflect its new, "off" status. In particular, a time on one-dimensional vector cell TIM$\phi$N(M), which establishes the real time when the load M is again to be turned on is set equal to the sum of the present time (TIME) and the minimum off period for the load M at the level I ($\phi$FTM(I)), i.e., $$\text{TIM}\phi\text{N(M)} = \text{TIME} + \phi\text{FTM(M,I)}. \tag{12}$$

The status (STATUS(M)) of load M is set to 0 to reflect the fact that the load M is turned off, and the transaction time (TRATM(M)) variable for the load M is set equal to time (TRATM(M)) = TIME) to indicate when the load M was turned off.

The SHED algorithm next computes the energy saved during the subject monitoring interval (ESV) by having the M-th load off. The energy saved (ESV) during the interval is the product of the power saved by turning the load off (L$\phi$AD(M)) and the lesser of the time remaining in the monitoring interval (MTG) or the time that the load will be off at the I-th level ($\phi$FTM(M,I)). Thus, a test 218 determines whether or not MTG exceeds $\phi$FTM(M,I) and, if so, causes execution of $$ESV = ESV + L\phi AD(M) * \phi FTM(M,I) \qquad (15)$$

If not, $$ESV = ESV + L\phi AD(M) * MTG \qquad (16)$$

is executed. In either case, the total energy saved ESV is updated by the proper amount to reflect the energy savings during the monitoring period by turning the load $66_m$ off.

Test 227 determines whether the total energy saved (contents of ESV) exceeds the power which must be shed (contents of SHEDRQ). If so, the system has deleted sufficient A.C. load, and exit is made from the SHED routine. If not (or if processing from the steps 214-227 is skipped because one of the tests 207, 210 or 212 failed indicating that the M-th load could not be turned off), the SHED algorithm examines (test 230) whether or not the contents of M equal N (the last of the system loads $66_n$). If not, the variable M is incremented (step 250 (e.g., by M = M+ 1) and processing begins in the manner above described by reading in the parameters of the next load to see whether that load can be shed. Thus, data processing for the above considered functional loop begins with the first load (M=1) and initeratively continues until either enough power has been shed at the initial, lowest priority level (J=0) signalled by the test 227 being satisfied - or until the last load $66_n$ has been processed (M=N), and there remains an additional shed requirement (contents of SHEDRQ> 0).

Assuming this latter event (test 230 satisfied), the priority level J is incremented (J = J + 1) and the new level J tested (test 239) to see whether a danger level (DNG) is attained. If so, an output warning is generated by step 240 by a system output alarm device. Assuming the more usual case where a danger level is not reached (test 239 fails),, the load indexing variable M is again initialized to 1 to begin iteration of the SHED algorithm in the manner above discussed to sequentially considering each load in turn, but at the next higher priority level.

Thus, again in overview and by way of summary, the SHED algorithm operates by serially examining loads $66_1$ - $66_n$ turning off those which may be turned off and which are of the lowest priority. Assuming that sufficient power cannot be shed at the lowest priority level, the priority variable J is progressively incremented and each of the loads examined seriatim until the requisite power has been deleted.

The composite system of FIGS. 1 - 3 thus operates in the manner above described to control system loads 66 in a manner assuring that excessive power is not consumed during a monitoring period (and thus no utility-imposed penalty or premium is incurred) because of an excess peak power demand, shedding loads as required. Where loads are shed, such shedding is effected on a priority basis, and in accordance with load defining parameters and priorities defined by load operational levels automatically or manually sensed or entered into the overall power regulating system.

The above-described arrangement is merely illustrative of the principles of the present invention. Numerous modifications and adaptations thereof will be readily apparent to those skilled in the art without departing from the spirit and scope of the present invention. Thus, for example, it will be readily apparent to those skilled in the art that the CPU 31 may utilize (and require) confirmation via the register 71 that a particular load $66_i$ is turned off before decrementing SHEDRQ; or that a load 66 is in fact on (and can thus be turned off) before executing step 214 (FIG. 3). Similarly, it is apparent that during any administration period, the contents of location TIME can be compared to the variables TIM$\phi$N(M) to turn loads 66 on at the appropriate times. Further, it will be apparent that "power" as used and claimed herein extends to D.C. energy — as well as other consumables (e.g., gas or other fluids) with appropriate electronic controllers (e.g., values) replacing the relays $60_i$, and meters being employed.

What is claimed is:

1. In combination in a power load shedding system for controlling the operative status of plural controllable system loads each selectively connectable to a source of energy, comprising stored program controlled digital computer means including a central processing unit and memory means communicating with said central processing means, said memory means including data storage means for each load for storing the characteristics and status of the associated load, plural controlled switch means for selectively connecting and disconnecting the controllable system loads with the energy source, control circuitry responsive to signals issued by said computer means for controlling the status of said controlled switch means, and means for signaling to said computer means the power being consumed by the system loads, said computer means including means for projecting energy consumption over a measuring interval, excessive power signaling means for comparing said projected energy consumption with a permissible bound therefor and for signaling when the projected consumption exceeds said permissible bound therefor, load shedding means responsive to said excessive power signaling means indicating an excessive energy consumption projection for examining said data storage means for the system loads in said memory means for selectively operating said controlled switch means via said control circuitry to operatively disconnect selected system loads from the energy source, wherein said control circuitry comprises a register having plural stages each signaling the desired relative operative condition for a different system load, and plural relays each responsive to the output of an associated register stage for controlling the state of an associated one of said plural controlled switch means, further comprising plural multi-position switches including a first pole serially included between said register and one of said controlled switch means associated therewith, further comprising status circuitry for supplying information to said central processing unit, said status circuitry including an additional register having a first plurality of stages, wherein each of said multi-position switches of said control circuitry includes an additional pole connected to a different stage to said additional register.

2. A combination as in claim 1 wherein said additional register includes an additional plurality of stages, and wherein each said controlled switch means includes a contact connected to a different one of said second stage plurality of said additional register.

3. In combination in a power load shedding system for controlling the operative status of plural controllable system loads each selectively connectable to a source of energy, comprising stored program controlled digital computer means including a central processing unit and memory means communicating with said central processing means, said memory means including data storage means for each load for storing the characteristics and status of the associated load, plural controlled switch means for selectively connecting and disconnecting the controllable system loads with the energy source, control circuitry responsive to signals issued by said computer means for controlling the status of said controlled switch means, and means for signaling to said computer means the power being consumed by the system loads, said computer means including means for projecting energy consumption over a measuring interval, excessive power signaling means for comparing said projected energy consumption with a permissible bound therefor and for signaling when the projected consumption exceeds said permissible bound therefor, load shedding means responsive to said excessive power signaling means indicating an excessive energy consumption projection for examining said data storage means for the system loads in said memory means for selectively operating said controlled switch means via said control circuitry to operatively disconnect selected system loads from the energy source, further comprising a power distribution bus, and wherein said power consumption signaling means comprises power meter means coupled to said bus, further comprising demand meter interface circuitry connecting said power meter means and said central processing unit, said demand meter interface circuitry including counter means for accumulating impulses each representative of a fixed quantity of energy consumption.

4. In combination in a power load shedding system for controlling the operative status of plural controllable system loads each selectively connectable to a source of energy, comprising stored program controlled digital computer means including a central processing unit and memory means communicating with said central processing means, said memory means including data storage means for each load for storing the characteristics and status of the associated load, plural controlled switch means for selectively connecting and disconnecting the controllable system loads with the energy source, control circuitry responsive to signals issued by said computer means for controlling the status of said controlled switch means, and means for signaling to said computer means the power being consumed by the system loads, said computer means including means for projecting energy consumption over a measuring interval, excessive power signaling means for comparing said projected energy consumption with a permissible bound therefor and for signaling when the projected consumption exceeds said permissible bound therefor, load shedding means responsive to said excessive power signaling means indicating an excessive energy consumption projection for examining said data storage means for the system loads in said memory means for selectively operating said controlled switch means via said control circuitry to operatively disconnect selected system loads from the energy source, further comprising a first plurality of system loads controlled by said controlled switch means, a second plurality of system loads, an additional plurality controlled switch means each controlling a different one of said additional loads, a remote system controller, additional control circuitry responsive to signals supplied thereto by said remote system controller for controlling the operative state of said additional controlled switch means, and coupling means interconnecting said stored program digital computer means with said remote system controller.

5. A combination as in claim 4 wherein said coupling means includes universal asyncronous receiver and transmitter means serially connected between said digital computer and said remote system controller.

6. A combination as in claim 5 wherein said remote system controller includes decoder and sequencer means.

7. A combination as in claim 4 wherein said remote system controller includes decoder and sequencer means.

8. In combination in a power load shedding system for controlling the operative status of plural controllable system loads each selectively connectable to a source of energy, comprising stored program controlled digital computer means including a central processing unit and memory means communicating with said central processing means, said memory means including data storage means for each load for storing the characteristics and status of the associated load, plural controlled switch means for selectively connecting and disconnecting the controllable system loads with the energy source, control circuitry responsive to signals issued by said computer means for controlling the status of said controlled switch means, and means for signaling to said computer means the power being consumed by the system loads, said computer means including means for projecting energy consumption over a measuring interval, excessive power signaling means for comparing said projected energy consumption with a permissible bound therefor and for signaling when the projected consumption exceeds said permissible bound therefor, load shedding means responsive to said excessive power signaling means indicating an excessive energy consumption projection for examining said data storage means for the system loads in said memory means for selectively operating said controlled switch means via said control circuitry to operatively disconnect selected system loads from the energy source, further comprising a first plurality of system loads connected to said controlled switch means and at least one additional system load, encoder means communicating with said central processing unit, a source of power, means for multiplexing power supplied by said power source and control signals generated by said encoder, and powerless remote terminal means comprising means selectively responsive to said multiplexed power and encoder supplied signals supplied by said multiplexing means for energizing said at least one additional load with the power supplied thereto.

9. A combination as in claim 8 wherein said powerless remote terminal means includes a separation filter, decoder, and latch and relay means.

10. In combination in a power load shedding system for controlling the operative status of plural controllable system loads each selectively connectable to a source of energy, comprising stored program controlled digital computer means including a central processing unit and memory means communicating with said central processing means, said memory means including data storage means for each load for storing the characteristics and status of the associated load, plural controlled switch means for selectively connecting and disconnecting the controllable system loads with the energy source, control circuitry responsive to signals issued by said computer means for controlling the status of said controlled switch means, and means for signaling to said computer means the power being consumed by the system loads, said computer means including means for projecting energy consumption over a measuring interval, excessive power signaling means for comparing said projected energy consumption with a permissible bound therefor and for signaling when the projected consumption exceeds said permissible bound therefor, load shedding means responsive to said excessive power signaling means indicating an excessive energy consumption projection for examining said data storage means for the system loads in said memory means for selectively operating said controlled switch means via said control circuitry to operatively disconnect selected system loads from the energy source, wherein said energy consumption projecting means includes means for determining the present rate of energy consumption responsive to the signals provided by said consumption signaling means, means for determining the power consumed since the beginning of an operative cycle, means for computing the energy postulated to be consumed over the remainder of a monitoring interval by determining the product of the time remaining to the end of a monitoring period and the present rate of power consumption, and means for summing the energy actually consumed to present with the energy postulated to be consumed within the remainder of the measuring interval, wherein said product determining means includes means for effectively multiplying the power saved by turning a load off with the lesser of the period the load is to be shut off or the remainder of a monitoring interval.

11. A combination as in claim 10 wherein said means for determining the present rate of consumption includes means for effecting a weighted average of signals indicative of power consumption during a most recent sampling interval and consumptions measured during earlier intervals.

12. In combination in a power load shedding system for controlling the operative status of plural controllable system loads each selectively connectable to a source of energy, comprising stored program controlled digital computer means including a central processing unit and memory means communicating with said central processing means, said memory means including data storage means for each load for storing the characteristics and status of the associated load, plural controlled switch means for selectively connecting and disconnecting the controllable system loads with the energy source, control circuitry responsive to signals issued by said computer means for controlling the status of said controlled switch means, and means for signaling to said computer means the power being consumed by the system loads, said computer means including means for projecting energy consumption over a measuring interval, excessive power signaling means for comparing said projected energy consumption with a permissible bond therefor and for signaling when the projected consumption exceeds said permissible bound therefor, load shedding means responsive to said excessive power signaling means indicating an excessive energy consumption projection for examining said data storage means for the system loads in said memory means for selectively operating said controlled switch means via said control circuitry to operatively disconnect selected system loads from the energy source, wherein said data storage means for each load includes means for storing the relative priority of the associated load, and wherein said load shedding means comprises means for iteratively examining said data storage for the system loads on a monotonically increasing priority basis, said central processing unit shedding loads via said control circuitry and said controlled switch means on a monotonically increasing priority basis, wherein said data storage means for said loads includes load characteristics which are differently defined depending upon a system operation level variable, and means for prescribing a value for said system operational level variable.

13. A combination as in claim 12 wherein said data storage means for the system loads includes level dependent minimum on and off times and priority variables, and level independent status, power and transaction time variables.

14. In combination in a power load shedding system for controlling the operative status of plural controllable system loads each selectively connectable to a source of energy, comprising stored program controlled digital computer means including a central processing unit and memory means communicating with said central processing means, said memory means including data storage means for each load for storing the characteristics and status of the associated load, plural controlled switch means for selectively connecting and disconnecting the controllable system loads with the energy source, control circuitry responsive to signals issued by said computer means for controlling the status of said controlled switch means, and means for signaling to said computer means the power being consumed by the system loads, said computer means including means for projecting energy consumption over a measuring interval, excessive power signaling means for comparing said projected energy consumption with a permissible bound therefor and for signaling when the projected consumption exceeds said permissible bound therfor, load shedding means responsive to said excessive power signaling means indicating an excessive energy consumption projection for examining said data storage means for the system loads in said memory means for selectively operating said controlled switch means via said control circuitry to operatively disconnect selected system loads from the energy source, wherein said data storage means for each load includes parameters dependent upon an operational level, and wherein said load shedding means includes nested iteratively operative means, wherein the inner of said iteratively operative means selectively sheds loads by examining data storage for each load at given load characterizing priority, and wherein the outer of said nested iterative loops monotonically indexes on increasing priority.

15. In combination in a power load shedding system for controlling the operative status of plural controllable system loads each selectively connectable to a source of energy, comprising stored program controlled digital computer means including a central processing unit and memory means communicating with said central processing means, said memory means including data storage means for each load for storing the characteristics and status of the associated load, plural controlled switch means for selectively connecting and disconnecting the controllable system loads with the energy source, control circuitry responsive to signals issued by said computer means for controlling the status of said controlled switch means, and means for signaling to said computer means the power being consumed by the system loads, said computer means including means for projecting energy consumption over a measuring interval, excessive power signaling means for comparing said projected energy consumption with a permissible bound therefor and for signaling when the projected consumption exceeds said permissible bound therefor, load shedding means responsive to said excessive power signaling means indicating an excessive energy consumption projection for examining said data storage means for the system loads in said memory means for selectively operating said controlled switch means via said control circuitry to operatively disconnect selected system loads from the energy source, wherein said data storage means for each load includes means for storing plural values for at least one load descriptor each operative for a distinct operational level, and said memory means includes means defining the then obtaining operational level.

16. A combination as in claim 15 wherein said central processing unit and memory means include indirect addressing means for processing load descriptors dependent upon said level defining means.

* * * * *